United States Patent [19]

Balaban et al.

[11] 4,243,953
[45] Jan. 6, 1981

[54] VOLTAGE CONTROLLED OSCILLATOR PRESENTING HIGH IMPEDANCE TO PARALLEL RESONANT TANK CIRCUIT

[75] Inventors: Alvin R. Balaban, Lebanon; Steven A. Steckler, Clark, both of N.J.

[73] Assignee: RCA Corporation, New York, N.Y.

[21] Appl. No.: 12,811

[22] Filed: Feb. 16, 1979

[51] Int. Cl.³ .......................... H03B 5/12; H03L 7/08
[52] U.S. Cl. .................................. 331/117 R; 331/8; 331/20; 331/34
[58] Field of Search .................... 331/117 R, 177 R, 8, 331/20, 36 R, 34; 358/158, 159; 325/419-423; 455/258-261, 264

[56] References Cited

U.S. PATENT DOCUMENTS

| | | | |
|---|---|---|---|
| 3,054,967 | 9/1962 | Gindi | 331/75 |
| 3,137,826 | 6/1964 | Boudrias | 331/60 |
| 3,553,459 | 1/1971 | Siedband et al. | 331/117 R X |
| 3,649,929 | 3/1972 | Thompson | 331/61 |
| 3,832,656 | 8/1974 | Ito et al. | 331/117 R X |
| 4,020,500 | 4/1977 | Harwood | 331/8 X |
| 4,055,817 | 10/1977 | Watanabe et al. | 331/117 R |

OTHER PUBLICATIONS

Wilcox, "Integrated TV Video Modulation System", IEEE Transactions on Consumer Electronics, Feb. 1977, p. 73.

Primary Examiner—Siegfried H. Grimm
Attorney, Agent, or Firm—Eugene M. Whitacre; William H. Meise; W. Brinton Yorks, Jr.

[57] ABSTRACT

A variable-frequency oscillator includes an oscillator portion coupled to a phase shifter and a controllable gain device for controlling the amount of phase-shifted signal reintroduced to the oscillator. The oscillator includes first and second transistors coupled at their emitters to a current source. The emitters of third and fourth transistors are coupled to bases of the first and second transistors, respectively. The base of the third transistor is coupled to a voltage source, and the base of the fourth transistor couples to the collector of the first to form a regenerative loop capable of oscillation. A parallel-resonant circuit is coupled between the collector of the first transistor and the voltage source for establishing a frequency-sensitive phase characteristic in the loop by which the quiescent frequency is determined. The phase shifter is coupled to a point on the regenerative loop. The controllable gain device is coupled to the output of the phase shifter and reinjects a variable-amplitude version of the phase-shifted signal to a second point on the loop for establishing the oscillation frequency.

10 Claims, 5 Drawing Figures

VOLTAGE CONTROLLED OSCILLATOR PRESENTING HIGH IMPEDANCE TO PARALLEL RESONANT TANK CIRCUIT

BACKGROUND OF THE INVENTION

This invention relates to voltage-controlled oscillators useful as horizontal oscillators in television applications.

In NTSC television practice, recurrent horizontal and vertical deflection of an electron beam to form a raster is synchronized with horizontal and vertical synchronizing pulses commingled in timed relation with the information to be displayed. In order to provide continuous deflection even in the absence of applied signals, the horizontal deflection is controlled by an oscillator which is synchronized with the synchronizing pulses contained in the composite video and which free-runs in the absence of synchronizing signals. Formerly, the oscillators were locked to the synchronizing signal in a direct manner, as by injection locking. In order for injection locking to be accomplished reliably, the free-running frequency of the oscillator must be near the horizontal deflection frequency. Due to the noise problems associated with direct synchronization, indirect synchronization has become universal. In indirect synchronization, a horizontal oscillator is coupled with a phase detector and a filter in a degenerative phase-lock feedback loop, in which the oscillator output is synchronized with the temporal average of the synchronizing pulses. The phase-lock loop allows a finite phase error between the oscillator signal and the average synchronizing signal, which error increases as the loop gain of the phase-lock loop decreases. In order to reduce the phase error, it is desirable to have the free-running frequency of the oscillator as near as possible to the NTSC deflection frequency of approximately 15,734 hz. It is generally desirable to avoid the need for horizontal HOLD (oscillator frequency) adjustments. To eliminate the HOLD control the automatic frequency and phase control (AFPC) of which the phase-lock loop is a part must have reliable and predictable operation under all conditions of temperature and tolerance extremes likely to be encountered. The voltage-controlled oscillator of such a loop must be stable and have a controlled range and rate of variation.

Resistance-capacitance (RC) or sawtooth oscillators are unstable with temperature and with time by comparison with inductance-capacitance (LC) types. Crystal oscillators, such as those described in U.S. Pat. No. 4,020,500 issued on Apr. 26, 1977 to L. A. Harwood and in U.S. Pat. No. 3,054,967 are stable but are difficult to pull off-frequency enough to lock to nonstandard synchronizing signals such as those from a home-type camera or a video tape recorder. Among the various LC oscillators, those using series-resonant circuits tend to have lower quality (Q) and are therefore lossier and less stable than the equivalent parallel-resonant type. A series-resonant oscillator is described in U.S. Pat. No. 4,055,817 issued Oct. 25, 1977 to Watanabe.

Among the parallel-resonant LC circuits, those requiring reactive impedance transformation to maintain high Q, such as the capacitive voltage divider shown in U.S. Pat. No. 3,553,459 issued Jan. 5, 1971 to Siedband are undesirable, because they require more than a minimum number of components.

Greatest reliability for a complex system such as an AFPC loop results when the major portion of the loop is in the form of an integrated circuit (IC). Oscillators having a parallel-resonant tank circuit coupled between the collectors of a differential transistor pair are generally unsuitable for integrated-circuit (IC) use because they require more than a minimum number of interface terminals or connection points between the IC and the external tank circuit. Among those which reduce the number of pins required by connecting one end of the tank circuit to a reference potential otherwise required for operation of the IC, the combination of the input impedance of the oscillator and of the external load may be an impedance low enough to degrade the Q of the tank circuit.

It is desirable to prevent the transistors of the oscillator from going into a nonlinear or saturated region in order to maximize stability and minimize waveform distortion. An arrangement for accomplishing this by the use of an automatic gain control circuit is shown in U.S. Pat. No. 3,649,929 issued Mar. 14, 1972 in the name of James Thompson. The AGC circuit corrects for the tolerances of, or for temperature or time-dependent changes in the values of the various components which may tend to drive the operating point of the oscillator to a state in which nonlinearity can occur. An AGC circuit, however, requires additional circuitry, including integrating capacitors. Such capacitors are not well suited to integrated circuit use. It is desirable to have a variable-frequency oscillator which operates with the transistors unsaturated and without the need for an AGC circuit. It is also desirable to have the variable-frequency oscillator circuit use a parallel-resonant tnak circuit in which the impedance presented to the tank is high so that the Q may be controlled by the external LC components and by an external resistor, and which is substantially free of circuit loading. It is also desirable to have the circuit resonate at the center frequency of the tank when the frequency control voltage is zero in order to make the VCO characteristic symmetrical and to minimize center-frequency drift.

SUMMARY OF THE INVENTION

A variable-frequency oscillator adapted to be energized by a source of energizing voltage comprises first and second transistors including base, emitter and collector electrodes, the emitter electrodes being coupled together and to a current source. Third and fourth transistors have emitter electrodes coupled to the base electrodes of the first and second transistors, respectively. The base of the third transistor is coupled to the source of energizing voltage, and the base of the fourth transistor is coupled to the collector of the first transistor to form a regenerative circuit loop capable of oscillation. A parallel-resonant circuit is coupled between the collector of the first transistor and the voltage source for establishing a frequency-sensitive phase characteristic in the loop. A variable phase shifting arrangement has an input coupled to a first point on the regenerative loop and an output coupled to a second point on the regenerative loop for extracting an oscillatory signal from the regenerative loop and for injecting a phase-shifted version of the oscillatory signal at another point on the loop to establish an oscillation frequency.

DESCRIPTION OF THE DRAWING

FIG. 1a illustrates in block and schematic diagram form a phase-lock loop suitable for use in a television receiver and embodying the invention;

FIG. 1b illustrates in schematic diagram form the alternating-current equivalent circuit of the oscillator of FIG. 1a;

FIG. 1c illustrates in schematic diagram form the biasing arrangement of the oscillator of FIG. 1a; and FIGS. 2 and 3 are alternate embodiments of the arrangement of FIG. 1a.

DESCRIPTION OF THE INVENTION

Figure 1B:
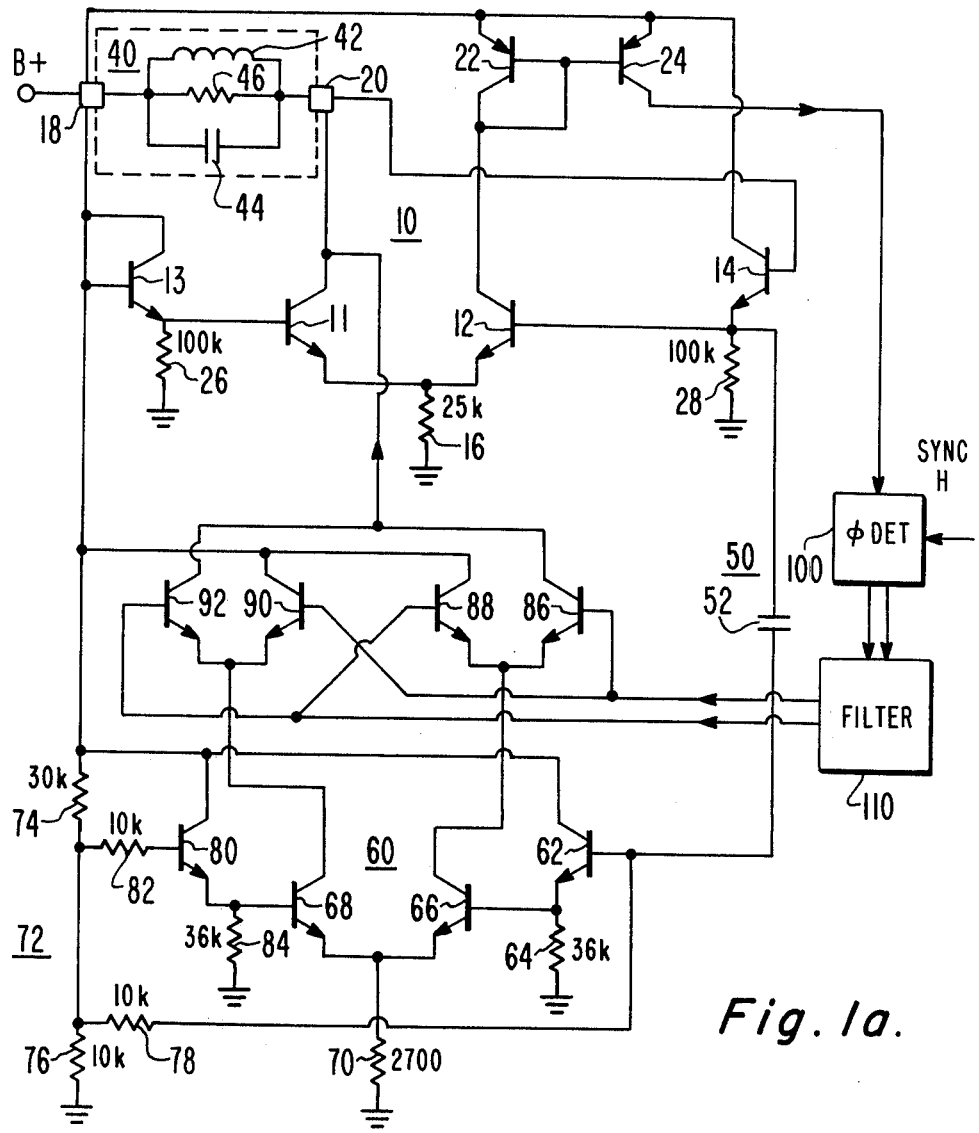
Figure 1B:
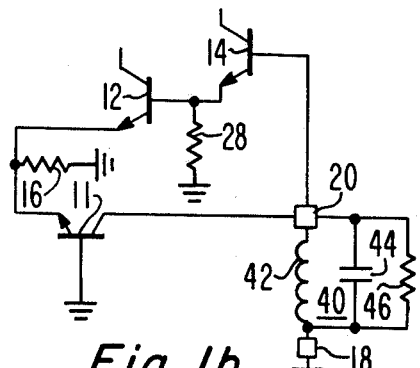

FIG. 1a illustrates generally an oscillator 10 operating at a nominal frequency determined by a tank circuit 40. An output of the oscillator is taken through a phase-shifting circuit 50 and applied to a multiplier circuit 60 which acts as a gain-variable amplifier to control the magnitude and sense of phase-shifted signal reinjected to the oscillator. Another output of the oscillator is coupled to a phase detector 100 where it is compared with a synchronizing signal such as the horizontal synchronizing signals from the sync separator of a television receiver. The output of the phase detector is filtered and applied as a control voltage to the multiplier for frequency and phase control of the oscillator.

Oscillator 10 includes first and second emitter-coupled NPN transistors 11 and 12. The joined emitters are supplied with current from a current source consisting of a resistor 16 coupled between the joined emitters and ground. Third and fourth NPN transistors 13 and 14 have their emitter electrodes coupled to the base electrodes of transistors 11 and 12, respectively. The base of diode-connected transistor 13 is coupled to an interface terminal 18 between the integrated circuit and the external source of B+. The base of transistor 14 is connected to the collector of transistor 11, and both are connected to an interface terminal 20. A regenerative circuit loop is formed by the path extending from the collector of transistor 11 through the base-emitter junctions of transistors 14 and 12 and back through the emitter-collector path of transistor 11, and this regenerative loop is capable of oscillation.

The collector of transistor 12 is coupled to supply by a diode-connected PNP transistor 22 coupled with a further PNP transistor 24 as a current mirror. The output of the current mirror is taken from the collector of transistor 24 to a phase detector illustrated as a block 100. Transistors 13 and 14 are operated in a linear portion of their characteristic by bias supplied from resistors 26 and 28, respectively, coupling their emitters to ground. The operating frequency of the regenerative loop is established by a tank circuit 40 coupled between terminals 18 and 20. Tank 40 includes an inductor 42 coupled in parallel with a capacitor 44. The quality or Q of the circuit may be determined by an external resistor 46 coupled across inductor 42.

An output is taken from the regenerative loop of oscillator 10 at a low-impedance point, the emitter of transistor 14. The output signal is coupled through a capacitor 52 of phase-shifting circuit 50 and is applied to the input of multiplier 60 at the base of transistor 62. The input impedance of multiplier 60 together with its biasing resistors aids in determining the phase shift of phase-shifting circuit 50. The collector of transistor 62 is coupled to supply and its emitter is coupled to the base of a transistor 66 and also to ground by a resistor 64. Transistor 66 forms with transistor 68 an emitter-coupled pair, the joined emitters of which are supplied with current by a resistor 70 coupled between the emitters and ground. A voltage divider designated generally as 72 and including resistors 74 and 76 is coupled between supply terminal 18 and ground. The voltage at the tap of divider 72 is coupled to bias the base of transistor 62 by a resistor 78. A similar bias is applied to the base of a transistor 80 by way of a resistor 82. The collector of transistor 80 is coupled to supply and the emitter is coupled to the base of transistor 68 and to ground by way of a resistor 84. The circuit including transistors 62-80 acts as a paraphase amplifier which converts the single-ended phase-shifted input signal into mutually out-of-phase signals at the collectors of transistors 66 and 68 for driving the remainder of multiplier 60 in a push-pull fashion.

The collector of transistor 66 is connected to the joined emitters of NPN transistors 86 and 88. The collector of transistor 68 is connected to the joined emitters of NPN transistors 90 and 92. The bases of transistors 88 and 92 are interconnected to form one half of the differential control input of the variable attenuator section of amplifier 60, and the bases of transistors 86 and 90 are interconnected to form the other half of the differential input. The differential control input to transistors 86-92 is coupled to the output of a filter circuit illustrated as a block 110. The collectors of transistors 86 and 92 are interconnected to form an output of multiplier 60, which output is coupled to the regenerative loop of oscillator 10 at the collector of transistor 11. The collectors of transistors 88 and 90 are interconnected and coupled to supply terminal 18.

The phase-lock loop is completed by coupling the output of phase detector 100 to the input of filter 110. A second input of phase detector 100 is coupled to a source of synchronizing signals, not shown, whereby the frequency and phase of oscillator 10 may be made to track the synchronizing signals. The operation of a phase-lock loop is well-known in the art and will not be discussed in detail herein. Similarly, multipliers such as multipliers 60 are well known and are described for example in U.S. Pat. No. 4,020,500 issued Apr. 26, 1977 in the name of Harwood. The operation of oscillator 10 may be understood with the aid of illustrative FIGS. 1b and 1c. FIG. 1b represents broadly and functionally the alternating-current equivalent circuit of the actual more detailed oscillator 10, in that the low-impedance sources have been taken as ground and biasing considerations have been ignored. The arrangement of FIG. 1b is recognizable as a common-base oscillator having a forward path from emitter to collector of transistor 11 and in which the feedback path includes the base-emitter junctions of transistors 12 and 14 and resistors 16 and 28. Resistor 28 and transistor 14 form an emitter-follower, as do resistor 16 and transistor 12. The cascade of the emitter followers is a transistor means having an effective base at the base of transistor 14 and an effective emitter at the emitter of transistor 12, which raises the effective impedance presented by the emitter of transistor 11, and thereby effectively unloads tank circuit 40, allowing its Q to be established by the LC components and/or resistor 46.

Figure 1C:
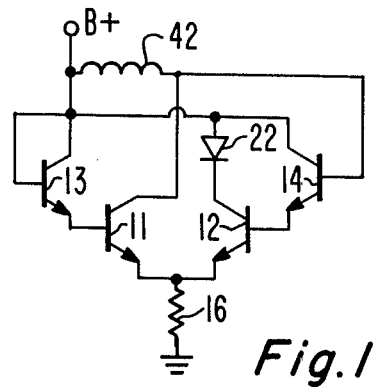

FIG. 1c illustrates the biasing arrangement of oscillator 10, in that alternating-current paths are not shown. As illustrated, the biasing is substantially symmetric. The quiescent voltage at the collector of transistor 11 is B+, its base voltage is 1 Vbe below B+ and its emitter is 2 Vbe below B+. It is thus possible for the collector of transistor 11 to swing almost 4 Vbe without saturating transistor 11. Consequently, changes in the Q of the tank circuit, temperature and/or time dependent changes in the saturation voltage of transistor 11 or in the value of resistor 16 are made smaller by comparison with the available swing. Since these unwanted variations in the circuit parameters do not critically affect the inventive arrangement, there is no need for an AGC control circuit to maintain an exact output level.

For integrated-circuit applications, the arrangement of FIG. 1a also has the advantage of conserving integrated-circuit area. Since the collectors of transistors 11, 86 and 92 are coupled together, it is possible to use a single isolation "boat" diffused into the monolithic portion of the IC for isolating the collectors from the substrate. The substantial symmetry of the circuit and light loading of the tank allow the oscillator to operate at the center frequency of the tank when the multiplier control voltage is at zero. This tends to make the frequency-change characteristic of the VCO symmetrical, which is very advantageous in television applications.

Control of the Q of the circuit by selection of the effective resistance paralleling tank circuit 40 allows external control of the oscillator gain.

Figure 2:
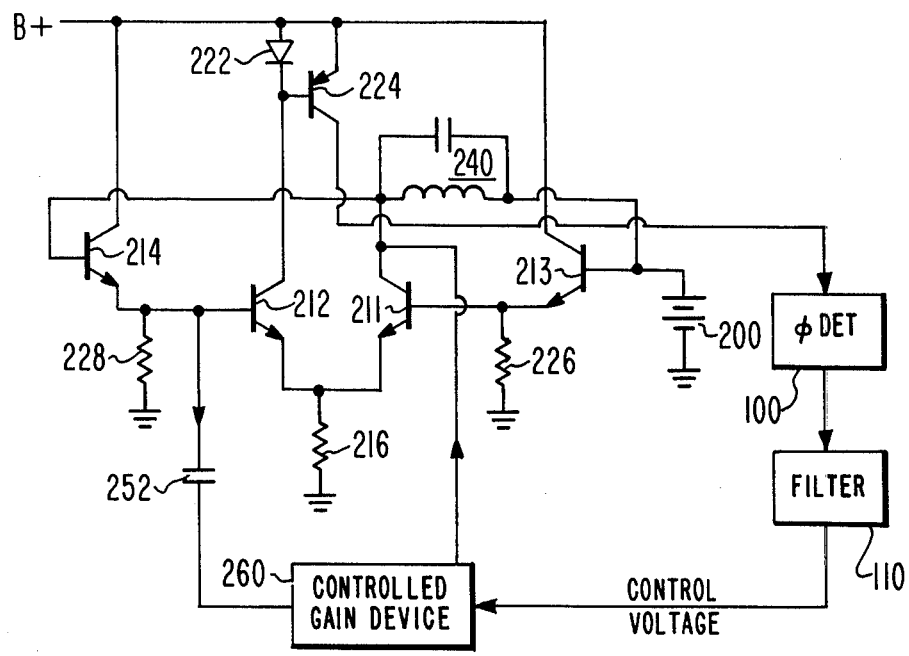

FIG. 2 illustrates an embodiment of the invention in which the biasing is rearranged to provide the possibility of temperature control. In the arrangement of FIG. 2, elements corresponding to those of FIG. 1a are given the same reference numbers in the 200 series. In FIG. 2, the collectors of transistors 212, 213 and 214 are coupled to B+ as in the arrangement of FIG. 1a but the tank circuit, the collector of transistor 211, and the bases of transistors 213 and 214 are coupled to a bias voltage supply represented as a battery 200 having a voltage lower than B+. In the arrangement of FIG. 2, the voltage across emitter resistor 216 is held at 2 Vbe below the potential of bias supply 200. The temperature coefficient of the oscillator may be controlled by adjustment of the voltage of bias source 200. For example, increasing the bias voltage increases the voltage across resistor 216, and increases the average collector current of transistors 211 and 212. The increased collector current of transistor 211 flows through resonant circuit 240, and increases the alternating voltage thereacross. This allows control of the alternating voltage at the collector of transistor 211 to prevent saturation.

Figure 3:
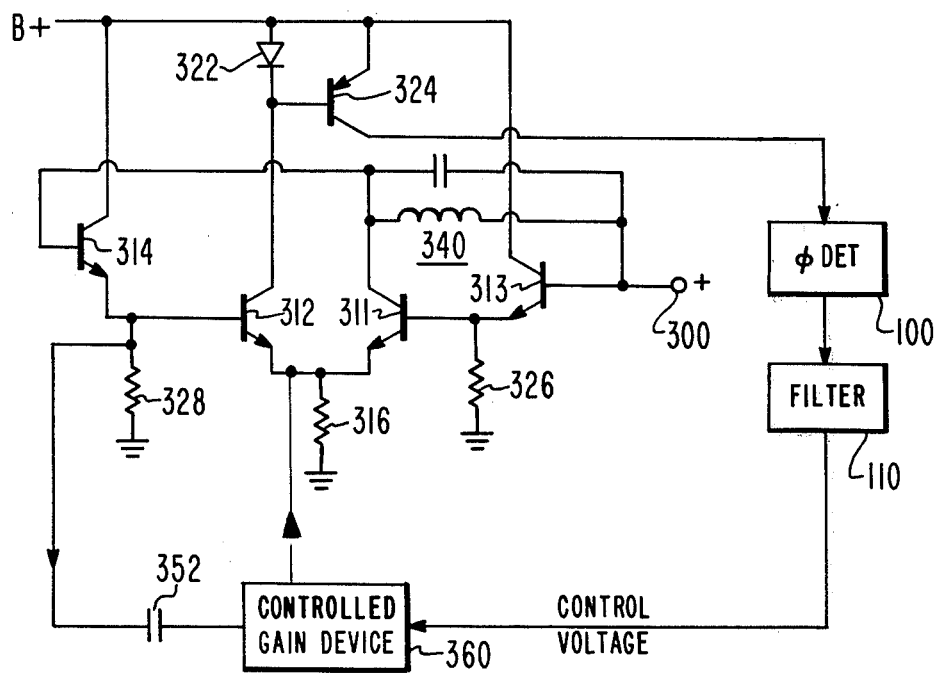

In FIG. 3, an oscillator circuit is illustrated which is similar to that of FIG. 2 but in which the tank circuit is further isolated from connections which may perturb the Q. In FIG. 3, elements corresponding to those of FIG. 1a are designated by the same reference numeral in the 300 series. In the arrangement of FIG. 3, the output of the controlled gain device illustrated as block 360, corresponding to multiplier 60 of FIG. 1a, is coupled to the joined emitters of transistors 311 and 312 rather than to the tank circuit as in FIGS. 1a and 2. This injection is at a point on the regenerative loop including the collector-emitter path of transistor 311 and base-emitter paths of transistors 312 and 314. The impedance of the controlled gain device, however, does not affect tank circuit 340 as may be the case in the arrangement of FIG. 1a because the signal injection is at a low-impedance point on the regenerative loop. With the arrangement of FIG. 3, tank circuit 340 is loaded only by the collector of transistor 311 and the base of transistor 314, whereas tank circuit 40 as illustrated in FIG. 1a is loaded by the collectors of transistors 11, 86 and 92 and by the base of transistor 14. Thus, greater control over the impedance of tank 40 and over the oscillator loop gain is provided in the arrangement of FIG. 3.

It will be apparent to those skilled in the art that greater stability may be achieved by increasing the number of cascaded emitter-followers in the regenerative feedback loop. Thus, three or more emitter followers may be cascaded in the same manner as that illustrated in FIGS. 1b and 1c for greater stability so long as additional base-emitter junctions are cascaded with the base-emitter junction of transistor 11 to maintain biasing symmetry. Also, current mirror 22, 24 of FIG. 1a may have its input coupled in the collector path of transistor 14 rather than 12.

What is claimed is:

1. A variable-frequency oscillator adapted to be controlled by a control voltage source, comprising:
    first and second transistors each including base, emitter and collector electrodes, said emitter electrodes of said first and second transistors being coupled together and to a source of current;
    third and fourth transistor means each including base and emitter electrodes, the emitter electrodes of said third and fourth transistor means being coupled to said base electrodes of said first and second transistors, respectively, the base of said third transistor means being coupled to a source of energizing voltage, and the base of said fourth transistor being coupled to said collector of said first transistor for forming a regenerative circuit loop capable of oscillation;
    a parallel-resonant circuit coupled between said collector of said first transistor and said source for establishing a frequency-sensitive phase characteristic in said loop; and
    variable phase-shifting means having an input coupled to a first point on said regenerative loop and an output coupled to a second point on said regenerative loop for extracting an oscillatory signal from said regenerative loop at said first point and for injecting a phase-shifted version of said oscillatory signal at said second point on said loop under the control of the control voltage source for establishing an oscillation frequency.

2. A variable-frequency oscillator according to claim 1 wherein said collectors of said second, third and fourth transistors are coupled to said source.

3. A variable-frequency oscillator according to claim 1 wherein said source of current comprises a resistor.

4. A variable-frequency oscillator according to claim 1 wherein said first point is said emitter of said fourth transistor.

5. A variable-frequency oscillator according to claim 4 wherein said second point is said collector electrode of said first transistor.

6. A variable-frequency oscillator according to claim 4 wherein said second point is said coupled emitters of said first and second transistors.

7. A variable-frequency oscillator according to claim 1 further comprising first and second resistance means coupling said emitters of said third and fourth transistors to a point of reference potential for biasing said third and fourth transistors to a linear operating condition.

8. A variable-frequency oscillator according to claim 1 further comprising a current mirror having its input coupled in series with one of said collectors of said second or fourth transistors.

9. A variable-frequency oscillator adapted to be energized by a source of direct potential, comprising:
    first and second emitter-coupled transistors, the collector of said first transistor being coupled to a first terminal of the source of direct potential and the emitters of said first and second transistors being coupled to a second terminal of said source of direct potential;

third transistor means, the base of which is coupled to the collector of said second transistor means, the emitter of which is coupled to the base of said first transistor means, and the collector of which is coupled to said first terminal of said source of direct potential;

a source of reference potential;

coupling means coupling the base of said second transistor with said source of reference potential;

a parallel-resonant circuit coupled between said base of said third transistor means and said point of reference potential to form an oscillator; and variable phase-shifting means having an input coupled to said emitter of said third transistor means and an output coupled to said base of said third transistor means for extracting an oscillatory signal from said oscillator and for injecting a phase-shifted version of said oscillatory signal to said parallel-resonant circuit.

10. An oscillator according to claim 9 wherein said coupling means comprises fourth transistor means, the base of which is coupled to said source of reference potential, the emitter of which is coupled to said base of said second transistor means, and the collector of which is coupled to said source of direct potential.

* * * * *